May 6, 1969

S. KAYE 3,443,102

SEMICONDUCTOR PHOTOCELL DETECTOR WITH VARIABLE SPECTRAL RESPONSE

Filed Oct. 28, 1964

STEPHEN KAYE,
INVENTOR

BY HIS ATTORNEYS
Spensley & Horn

United States Patent Office 3,443,102
Patented May 6, 1969

3,443,102
SEMICONDUCTOR PHOTOCELL DETECTOR WITH VARIABLE SPECTRAL RESPONSE

Stephen Kaye, Pasadena, Calif., assignor to Electro-Optical Systems, Inc., Pasadena, Calif., a corporation of California Filed Oct. 28, 1964, Ser. No. 407,025
Int. Cl. H03k 3/42; H02h 3/28; H01j 39/12
U.S. Cl. 250—211 10 Claims

ABSTRACT OF THE DISCLOSURE

A semiconductor photocell detector including preferably two rectifying junctions disposed substantially parallel to that surface of the semiconductor body which is exposed to incident radiation. The long wavelength cutoff frequencies of the detector may be varied by varying the reverse bias applied to one of the two junctions.

It is well known in the art that junctions between regions of opposite conductivity types in bodies of semiconductive material are photosensitive. Semiconductor photodiodes, operated in either the photovoltaic or reverse bias modes, are in common use. In semiconductor photoconductive detectors the change in resistance of a single region of semiconductive material exposed to radiation is measured, rather than changes in the characteristics of a junction separating two regions of opposite conductivity type semiconductor material.

Semiconductor photocells have a spectral sensitivity which is determined primarily by the inherent characteristics of the semiconductor material used. Maximum sensitivity is achieved when the wave length of the radiation incident upon the photocell is somewhat less than the long wave length cut-off of the semiconductor material. The long wave length cut-off is inversely proportional to the size of the forbidden energy zone between the valence band and the conduction band of the semiconductor material utilized. The long wave length cut-off for silicon, for example, is 1.1 microns. Thus, the normal silicon photocell has a fixed cut-off of 1.1 microns and is most sensitive to incident radiation of about 0.8–1.0 micron wave length. The sensitivity of a semiconductor photocell to incident radiation of wave length greater than its long wave length cut-off is effectively zero, while its sensitivity to shorter wave length radiation decreases with increasing radiation frequency. The absorption coefficients for different semiconductor materials increase at different rates as the wave length of incident radiation is decreased from the long wave length cut-off.

Semiconductor materials have been generally classified into two types, so-called "direct" and "indirect," depending upon their relative rates of variation of absorption coefficient with changes in incident radiation wave length below the long wave length cut-off, the direct materials having the more rapid rates of variation. Examples of commonly used indirect materials are silicon, germanium and aluminum antimonide.

The present invention is directed toward achieving greater versatility and significantly advancing the art by providing a semiconductor photocell structure wherein the long wave length cut-off is selectively variable. Such tunable photocells can be used as scanning spectrometers to observe the radiation of some source as a function of its wave length, or to determine the temperature of a radiating black body, for example.

In accordance with the present invention the variation in long wave length cut-off is in response to an applied electrical signal. A presently preferred embodiment of this electrically tunable photocell comprises a body of semiconductor material having first and second rectifying junctions substantially parallel to the surface exposed to incident radiation thereby defining a first region of one conductivity type separating second and third surface regions of the other conductivity type. The first junction is quite close to the exposed surface to define a very thin second surface region. The second junction is reverse biased to provide an alternative sink for carriers generated in the central first region. The third surface region is more heavily doped than the central first region so that variation of the reverse bias applied to the second junction will effectively alter the long wave length cut-off of the device, as will be hereinbelow explained.

Accordingly, it is an object of the present invention to provide an improved semiconductor photodetector.

It is also an object of the present invention to provide a semiconductor photodetector element wherein the long wave length cut-off can be selectively varied.

It is another object of the present invention to provide a semiconductor photodetector device wherein the long wave length cut-off can be selectively varied in response to an applied electrical signal.

It is a further object of the present invention to provide an improved electrically tunable semiconductor photodetector.

It is still another object of the present invention to provide an improved and more versatile semiconductor photocell.

It is a yet further object of the present invention to provide a semiconductor photocell wherein the spectral sensitivity can be controllably varied.

The novel features which are believed to be characteristic of the invention, both as to its organization and method of operation, together with further objects and advantages thereof will be better understood from the following description considered in connection with the accompanying drawing in which presently preferred embodiments of the invention are illustrated by way of example. It is to be expressly understood, however, that the drawing is for the purpose of illustration and description, and is not intended as a definition of the limits of the invention.

Figures 1, 2, 3, 4, 5, 6, 7:
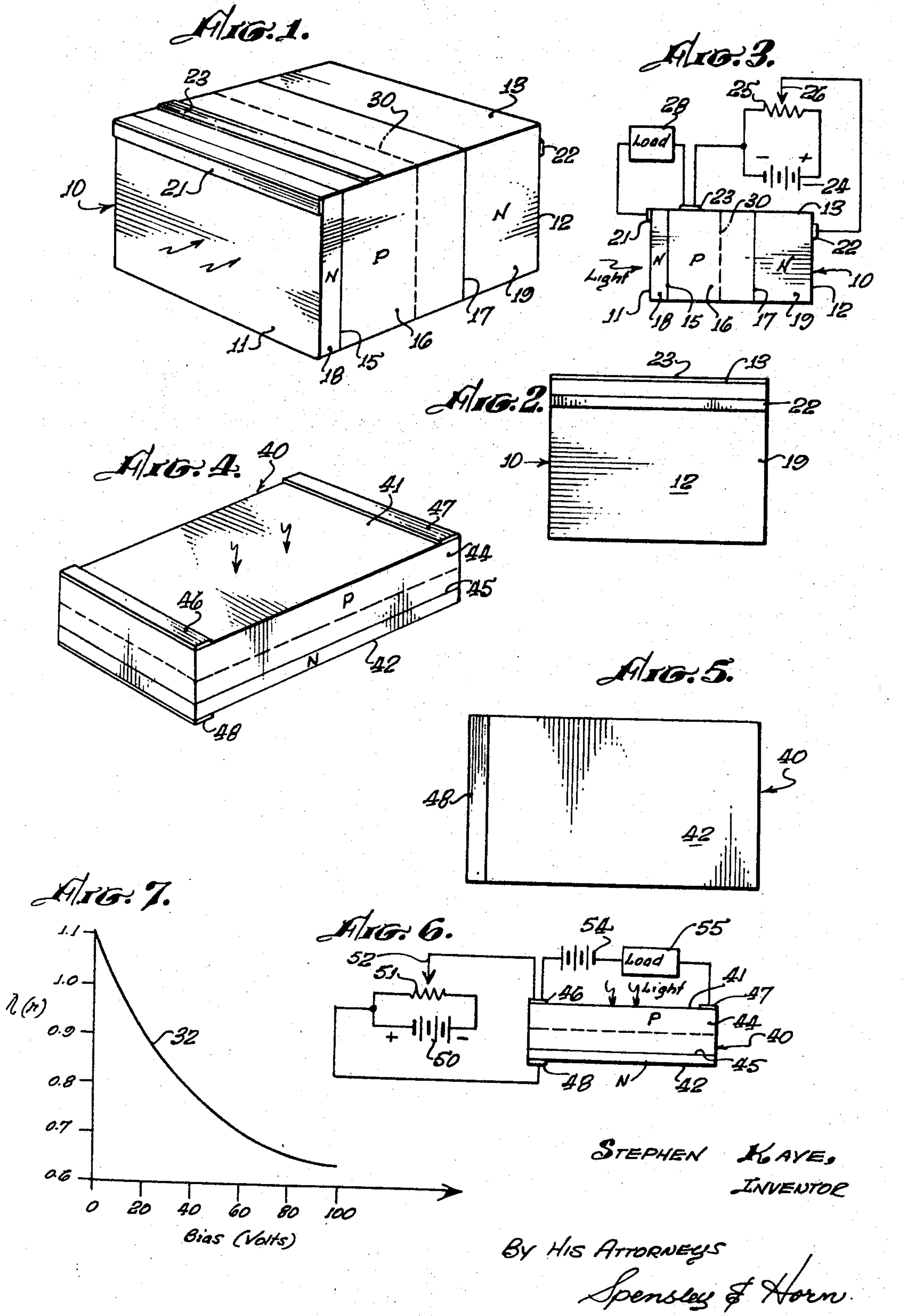
FIGURE 1 is a perspective view showing one embodiment of the present invention photocell.
FIGURE 2 is an end view of the photocell of FIGURE 1.
FIGURE 3 is a cross-sectional and schematic view of the semiconductor device of FIGURE 1 and associated circuitry.
FIGURE 4 is a perspective view of another embodiment of the present invention photocell.
FIGURE 5 is a bottom view of the photocell of FIGURE 4.
FIGURE 6 is a cross-sectional and schematic view of the semiconductor device of FIGURE 4 and associated circuitry.
FIGURE 7 is a graph depicting the variation of long wave length cut-off with applied bias for a present invention photocell fabricated from silicon.

Turning now to the drawing, in FIGURES 1, 2 and 3 there are shown various views of one embodiment of the electrically tunable photodetector of the present invention. The device can be fabricated from any indirect type of semiconductor material to which a rectifying junction can be made. In the illustrated examples the material used is silicon. The first embodiment is fabricated from a semiconductor crystal body 10 of P type silicon. The silicon body 10 is of generally rectangular configuration and defines a front surface 11, a rear surface 12 and a top surface 13.

A shallow first PN junction 15 is formed parallel to the front surface 11 by the diffusion of phosphorus for example, into the front surface 11 of the crystal body. A second PN junction 17 is formed parallel to the front surface 11 by diffusion of phosphorus, for example, into the rear surface 12 of the crystal body 10. Thus there is formed a central P type region 16 separating two N type regions 18 and 19.

The PN junction 15 should be as shallow as can be conveniently made, in order to provide a greater operating range with respect to wave length of incident radiation. The maximum permissible spacing of the junction 15 from the front surface 11 is determined by the absorption coefficient ($\alpha$) of the semiconductor material at the wave lengths of incident radiation to be detected, the maximum spacing being slightly less than $1/\alpha$. In the case of silicon the maximum spacing is therefore on the order of 1 micron, with a shallow junction depth of about 0.5 micron being presently preferred.

The second PN junction 17 is spaced a distance greater than $1/\alpha$ from the front surface 11 with the distance between junctions being sufficient so that the radiation to be detected will be absorbed in the central region 16. The spacing of the junction 17 from the rear surface 12 is not critical, although it is preferred that this spacing be on the order from about 1 to 10 mils to insure adequate structural strength. For proper device operation it is necessary that the outer N type surface region 19 be more highly doped than the parent crystal material forming the central P type region 16. Silicon parent crystal material for use in the present invention device is typically doped to a level of about $10^{14}$ to $10^{15}$ atoms/cm.$^3$, the outer N type region 19 being typically doped to a level of $10^{19}$ atoms/cm.$^3$ or greater ($10^{19}$–$10^{21}$ atoms/cm.$^3$).

An electrical contact strip 21 is provided in low resistance ohmic contact to the front surface 11 of the crystal body for establishing electrical contact with the outer N type region 18. An electrical contact strip 22 is provided in low resistance ohmic contact to the rear surface 10 of the crystal body for establishing electrical contact with the outer N type region 19. A similar electrical contact strip 23 is provided in low resistance ohmic contact to the top surface 13 of the crystal body for establishing electrical contact with the central P type region 16. The strip contacts 21–23 can be formed by any well-known metalizing technique, such chemiplating, electroplating or evaporation, for example. Since suitable diffusion, masking and metalizing techniques are well-known in the art, they will not be discussed in further detail.

A direct current biasing source, such as a battery 24, is shunted by a potentiometer 25 provided with a movable tap 26. As shown in FIGURE 3, the negative terminal of the battery 24 is connected to the electrical contact 23 and the movable tap 26 of the potentiometer is connected to the electrical contact 22. Therefore, the battery 24 is connected to reverse bias the PN junction 17, the amount of bias voltage being selectively variable by adjustment of the movable tap 26 of the potentiometer from zero bias up to the maximum battery potential.

As stated hereinabove, for proper device operation the PN junction 15 must be shallow and the N type outer region 19 must be more heavily doped than the central P type region 16 of the silicon crystal body 10. In considering the device operation, momentarily ignoring the presence of the PN junction 17, the PN junction 15 provides a normal photodiode which can be operated in either the photovoltaic or reverse bias mode. Since the semiconductor material is of the indirect type and since the PN junction 15 is close to the surface which is exposed to radiation, the photo response at certain wave lengths will be determined by the generation of carriers in the center region 16 and their subsequent transport by diffusion to the junction 15. Now considering the effect of the reverse biased PN junction 17, this junction will be an alternative sink for carriers generated in the center region 16. Since the outer region 19 is more heavily doped than the central region 16, the application of reverse bias to the PN junction 17 will move the edge of the depletion region (generally indicated by the dotted line 30) toward the PN junction 15. This will reduce the number of carriers collected by the PN junction 15. This reduction occurs because of increase carrier collection by junction 17. The carriers collected by junction 17 are those generated by longer wavelengths and thus variation of the bias on junction 17 varies the long wave cutoff junction 15. These collected carriers are primarily those generated by longer wave lengths. Thus, by varying the bias on the PN junction 17 the long wave cut-off can be effectively varied.

Referring now to FIGURE 7 of the drawing there is shown a graph plotting the long wave length cut-off of the device for incident radiation plotted as a function of reverse bias voltage applied to the PN junction 17. The graph depicts a curve 32 which shows that with no bias voltage applied to the PN junction 17 the long wave length cut-off will be 1.1 microns, the device there operating as a normal photocell. However, upon application of a reverse bias voltage to the PN junction 17 the long wave length cut-off of the device is lowered. The curve 32 shows that a long wave length cut-off of slightly greater than 0.6 micron is achieved with a reverse bias of 100 volts applied to the PN junction 17. Upon the fabrication of such a device, the curve 32 for that particular device may be experimentally determined, whereby the device may be readily adjusted to any desired long wave length cut-off within its range.

As stated hereinabove the reverse bias applied to the PN junction 17 results in shortening the long wave length cut-off of the device, this shortening being due to control of the distribution of carriers generated between the two junctions. If the radiation incident upon the front surface 11 of the silicon crystal body is a short wave length (equivalent to greater than 2.5 e.v. for silicon) this radiation will be absorbed between the front surface 11 and the PN junction 15 which is about 0.5 micron in depth. In this case the PN junction 17 has no effect. The effect of the PN junction 17 comes into play for radiation of longer wave lengths which will be absorbed in the central region 16 extending between the PN junctions 15 and 17. Under these conditions the photo response of the device will be determined by the bias voltage as the bias voltage will cause the carriers generated in the central region 16 to be attracted toward the PN junction 15. This enables control of the distribution of carriers between the two junctions by selective movement of the edge of the depletion region toward the PN junction 15.

In accordance with these operating concepts the distance between the rectifying junctions 15 and 17 must be at least comparable to the maximum width of depletion region that can be achieved with the reverse bias, and the junction parameters must be such that the width of the space charge with maximum bias will be of the same order as the width of the central region 16. Therefore, in most cases the thickness of the central region 16 will be many times greater than the thickness of the outer region 18. In the illustrated embodiment using silicon and a junction depth of about 0.5 micron for the shallow junction 15, the PN junction 17 is typically spaced within the range of from about 5 to about 100 microns from the front surface 11. With a 100 micron depth for the junction 17, under conditions of zero bias the edge of the depletion region will be typically about one micron from the PN junction 17 and with 100 volts applied bias the edge of the depletion region will be about 50 microns from the PN junction 17, depending upon the resistivity of the center region.

Turning now to FIGURES 4, 5 and 6 of the drawing there are shown views of an alternative photoconductive detector embodiment of the present invention device. This device embodiment is fabricated from a semiconductor crystal body 40 of N type silicon. The silicon body 40 is of generally rectangular configuration and defines a front surface 41 and a rear surface 42. A PN junction 45 is formed parallel to the front surface 41 by the diffusion of boron, for example, into the front surface 41 of the crystal body 40, thereby defining a P type surface region 44. The PN junction corresponds to the deep junction 17 of the FIGURE 1 embodiment, and the depth of the junction 45 as measured from the front surface 41 is determined in an identical manner to the depth of the junction 17 in the FIGURE 1 embodiment. The distance from the junction 45 to the rear surface 42 is not critical.

Electrical contact strips 46 and 47 are provided in low resistance ohmic contact to the opposing end portions of the front surface 41 of the crystal body 40. An electrical contact strip 48 is provided in low resistance ohmic contact to the rear surface 42 of the crystal body.

As shown in FIGURE 6, a direct current biasing source, such as a battery 50, is shunted by a potentiometer 51 having a movable tap 52. The negative terminal of the battery 50 is connected to the electrical contact 48, the movable tap 52 of the potentiometer 51 being connected to the electrical contact 46. An electrical load 55 is connected in series with a biasing battery 54 between the contact 46 and 47.

In this embodiment, changes in the resistance of the surface region 44 upon exposure of the front surface 41 to incident radiation are measured by photoconductive detection. Reverse biasing of the junction 45 varies the long wave length cut-off of the device in a manner similar to that of the embodiment of FIGURE 1.

Thus there have been described various embodiments of novel electrically tunable photodetector elements fabricated from indirect semiconductor materials to which rectifying junctions can be established. Although the invention has been described with a certain degree of particularity, it is understood that the present disclosure has been made only by way of example and that numerous changes in the details of construction and the combination and arrangement of parts may be resorted to without departing from the spirit and the scope of the invention as hereinafter claimed. For example, although the illustrative embodiments utilize diffused junctions, any other type of rectifying junction that can be established to the semiconductor material can be utilized, such as hetero junctions and surface barrier type junctions. Also, PNP configurations are suitable as well as the illustrated NPN configurations.

What is claimed is:

1. A semiconductor photodetector for radiation having wave lengths within a predetermined range, comprising:

(a) a body of semiconductor material of the indirect type defining a planar front surface for exposure to radiation to be detected;

(b) a deep rectifying junction in said semiconductor body, said rectifying junction being parallel with said front surface and spaced therefrom a sufficient distance so that radiation of wave lengths within said predetermined range incident upon said front surface will be absorbed within said semiconductor body in the region between said front surface and said rectifying junction wherein said distance is from 5 to 100 microns;

(c) means for applying a selectively variable reverse bias voltage to said rectifying junction to thereby enable controllable variation of the long wave length cut-off of said semiconductor photodetector; and (d) means for connecting external circuitry to said semiconductor body for indicating the photoresponse of said photodetector.

2. A semiconductor photodector for radiation having wave lengths within a predetermined range, comprising:

(a) a body of semiconductor material of the indirect type defining a planar front surface for exposure to radiation to be detected;

(b) a shallow first rectifying junction in said semiconductor body, said first rectifying junction being parallel with said front surface and spaced therefrom a distance less than $1/\alpha$, where $\alpha$ is the absorption coefficient of said semiconductor material for radiation of wave lengths within said predetermined range;

(c) a deep second rectifying junction in said semiconductor body, said second rectifying junction being parallel to said front surface and spaced from said first rectifying junction a sufficient distance so that radiation of wave lengths within said predetermined range incident upon said front surface will be absorbed within said semiconductor body in the region between said first and second rectifying junctions, and wherein the distance between said first junction and said second junction is greater than the diffusion length of carriers generated by radiation received at said front surface;

(d) means for applying a selectively variable reverse bias voltage to said second rectifying junction to thereby enable controllable variation of the long wave length cut-off of said semiconductor photodetector; and (e) means for connecting external circuitry across said first rectifying junction for indicating the photoresponse of said photodetector.

3. A semiconductor photodetector for radiation having wave lengths within a predetermined range, comprising:

(a) a body of semiconductor material of the indirect type defining a planar front surface for exposure to radiation to be detected;

(b) a deep rectifying junction in said semiconductor body, said rectifying junction being parallel with said front surface and spaced therefrom a sufficient distance so that radiation of wave lengths within said predetermined range incident upon said front surface will be absorbed within said semiconductor body in the region between said front surface and said rectifying junction;

(c) means for applying a selectively variable reverse bias voltage to said rectifying junction to thereby enable controllable variation of the long wave length cut-off of said semiconductor photodetector; and (d) first and second low resistance ohmic contacts established to said planar front surface at opposite ends thereof for connection to external circuitry for indicating the photoconductive response of said photodetector.

4. A semiconductor photodetctor for radiation having wave lengths within a predetermined range, comprising: a body of semiconductor material of the indirect type defining a planar front surface for exposure to radiation to be detected and a rear surface, said semiconductor body defining a central first region of one conductivity type between second and third surface regions of the opposite conductivity type from said first conductivity type, said second surface region extending inwardly from said planar front surface and being separated from said central first region by a first rectifying junction parallel with said planar front surface and spaced therefrom a distance less than $1/\alpha$, where $\alpha$ is the absorption coefficient of said semiconductor material for radiation of wave lengths within said predetermined range, said third surface region extending inwardly from said rear surface and being separated from said central first region by a second rectifying junction parallel to said front surface and spaced therefrom a sufficient distance so that radiation of wave lengths within said predetermined range incident upon said front surface will be absorbed within said central first region, and wherein the distance between said first junction and said second junction is greater than the diffusion length of carriers generated by radiation received at said front surface, said third surface region being more highly doped than said central first region; means for connecting a source of selectively variable D.C. potential to said first and third regions to reverse bias said second rectifying junction and thereby enable controllable variation of long wave length cut-off of said semiconductor photodetector; and means for connecting external circuitry to said first and second regions for indicating the photoresponse of said photodetector.

5. A semiconductor photodetector for radiation having wave lengths within a predetermined range, comprising: a silicon body defining a planar front surface and a rear surface, said silicon body defining a central first region of one conductivity type between second and third surface regions of the opposite conductivity type from said first conductivity type, said second surface region extending inwardly from said planar front surface and being separated from said central first region by a first rectifying junction parallel with said planar front surface and spaced therefrom a distance not in excess of one micron, said third surface region extending inwardly from said rear surface and being separated from said central first region by a second rectifying junction parallel to said planar front surface and spaced therefrom a distance within the range of from about five to about one hundred microns, said third surface region being more highly doped than said central first region, and wherein the distance between said first junction and said second junction is greater than the diffusion length of carriers generated by radiation received at said front surface; means for connecting a source of selectively variable D.C. potential to said first and third regions to reverse bias said second rectifying junction and thereby enable controllable variation of the long wave length cut-off of said semiconductor photodetector; and means for connecting external circuitry to said first and second regions for indicating the photo-response of said photodetector.

6. The photodetector defined in claim 4, wherein the semiconductor material is silicon, said central first region is doped to a level within the range of from about $10^{14}$ to about $10^{15}$ atoms per cubic centimeter, and said third surface region is doped to a level within the range of from about $10^{19}$ to $10^{21}$ atoms per cubic centimeter.

7. The photodetector defined in claim 4, wherein the semiconductor material is silicon, said first rectifying junction is spaced about five microns from said planar front surface, and said second rectifying junction is spaced about fifty microns from said planar front surface.

8. A semiconductor photodetector for radiation having wave lengths within a predetermined range, comprising a body of semiconductor material of the indirect type defining a planar front surface for exposure to radiation to be detected and a rear surface, said semiconductor body further defining a first surface region of one conductivity type contiguous with a second surface region of the opposite conductivity type, said first surface region extending inwardly from said planar front surface, said second surface region extending inwardly from said rear surface, said first and second surface regions being separated by a rectifying junction parallel with said planar front surface and spaced therefrom a sufficient distance so that radiation of wave lengths within said predetermined range incident upon said front surface will be absorbed within said first surface region; means for connecting a source of selectively variable D.C. potential to said first and second surface regions to reverse bias said rectifying junction and thereby enable controllable variation of the long wave length cut-off of said semiconductor photodetector; and means for connecting external circuitry to opposite ends of said planar front surface for indicating the photoconductive response of said photodetector.

9. A semiconductor photodetector for radiation having wave lengths within a predetermined range, comprising a silicon body defining a planar front surface for exposure to radiation to be detected and a rear surface, said silicon body further defining a first surface region of one conductivity type contiguous with a second surface region of the opposite conductivity type, said first surface region extending inwardly from said planar front surface, said second surface region extending inwardly from said rear surface, said first and second surface regions being separated by a rectifying junction parallel with said planar front sufrace and spaced distance within the range of from about fifty to about one hundred microns; means for connecting a source of selectively variable D.C. potential to said first and second surface regions to reverse bias said rectifying junction and thereby enable controllable variation of the long wave length cut-off of said semiconductor photodetector; and means for connecting external circuitry to opposite ends of said planar front surface for indicating the photoconductive response of said photodetector.

10. The semiconductor photodetector defined in claim 8, wherein said first surface region is doped to a level within the range of from about $10^{14}$ to about $10^{15}$ atoms per cubic centimeter, and said second surface region is doped at a level within the range of from about $10^{19}$ to $10^{21}$ atoms per cubic centimeter.

References Cited

UNITED STATES PATENTS

| | | | |
|---|---|---|---|
| 2,985,805 | 5/1961 | Nelson | 317—235 |
| 2,993,998 | 7/1961 | Lehovec | 250—211 |
| 3,002,100 | 9/1961 | Rutz | 250—211 |
| 3,051,840 | 8/1962 | Davis | 250—211 |
| 3,081,418 | 3/1963 | Manintveld et al. | |

RALPH G. NILSON, *Primary Examiner.*

T. N. GRIGSBY, *Assistant Examiner.*

U.S. Cl. X.R.

307—311; 317—27, 234